United States Patent
Xie

(10) Patent No.: US 9,252,394 B2
(45) Date of Patent: Feb. 2, 2016

(54) ORGANIC LIGHT EMITTING DISPLAY APPARATUS ENCAPSULATED WITH HYDROPHOBIC ORGANIC FILM AND MANUFACTURING METHOD THEREOF

(71) Applicants: Shanghai Tianma AM-OLED Co., Ltd., Shanghai (CN); Tianma Micro-Electronics Co., Ltd., Shenzhen (CN)

(72) Inventor: Zaifeng Xie, Shanghai (CN)

(73) Assignees: Shanghai Tianma AM-OLED Co., Ltd., Shanghai (CN); Tianma Micro-Electronics Co., Ltd., Shenzhen (CN)

( * ) Notice: Subject to any disclaimer, the term of this patent is extended or adjusted under 35 U.S.C. 154(b) by 0 days.

(21) Appl. No.: 14/463,569

(22) Filed: Aug. 19, 2014

(65) Prior Publication Data
US 2015/0171369 A1   Jun. 18, 2015

(30) Foreign Application Priority Data
Dec. 18, 2013   (CN) .......................... 2013 1 0697551

(51) Int. Cl.
| | | |
|---|---|---|
| H01L 29/08 | (2006.01) | |
| H01L 29/04 | (2006.01) | |
| H01L 33/00 | (2010.01) | |
| H01L 51/40 | (2006.01) | |
| H01L 51/52 | (2006.01) | |
| H01L 51/56 | (2006.01) | |

(52) U.S. Cl.
CPC ............ *H01L 51/5256* (2013.01); *H01L 51/56* (2013.01)

(58) Field of Classification Search
CPC ............ H01L 51/0545; H01L 51/0036; H01L 51/0541; H01L 51/5012; H01L 51/50; H01L 33/50; H01L 51/56; H01L 51/5256; H01L 51/5237; H01L 51/448
USPC ............... 257/40, 59, 98, 88, 99, 13, 79, 100, 257/E33.061, 500; 438/27, 99, 26, 478
See application file for complete search history.

(56) References Cited

U.S. PATENT DOCUMENTS

| | | | | |
|---|---|---|---|---|
| 2004/0048957 | A1* | 3/2004 | Medsker et al. | 524/107 |
| 2005/0017633 | A1* | 1/2005 | Miyadera | 313/512 |
| 2006/0029757 | A1* | 2/2006 | Komada | 428/35.7 |
| 2006/0216951 | A1* | 9/2006 | Moro et al. | 438/778 |
| 2007/0049155 | A1* | 3/2007 | Moro et al. | 445/24 |
| 2010/0051912 | A1* | 3/2010 | Gregory | 257/40 |
| 2011/0068321 | A1* | 3/2011 | Pickett et al. | 257/13 |
| 2012/0298195 | A1* | 11/2012 | Plee et al. | 136/256 |

FOREIGN PATENT DOCUMENTS

| | | |
|---|---|---|
| KR | 10-0688366 B1 | 3/2007 |
| TW | 201320324 A | 5/2013 |

* cited by examiner

*Primary Examiner* — Long K Tran
*Assistant Examiner* — Dzung Tran
(74) *Attorney, Agent, or Firm* — Alston & Bird LLP

(57) ABSTRACT

An organic light emitting display apparatus is disclosed. The display apparatus includes a substrate, an organic light emitting unit on the substrate, and a film encapsulation layer on the organic light emitting unit. The film encapsulation layer includes a hydrophobic organic layer disposed at an outermost portion of the film encapsulation layer.

18 Claims, 3 Drawing Sheets

ORGANIC LIGHT EMITTING DISPLAY APPARATUS ENCAPSULATED WITH HYDROPHOBIC ORGANIC FILM AND MANUFACTURING METHOD THEREOF

CROSS-REFERENCES TO RELATED APPLICATIONS

This application claims the benefit of priority to Chinese Patent Application No, 201310697551.3, filed with the Chinese Patent Office on Dec. 18, 2013 and entitled "ORGANIC LIGHT EMITTING DISPLAY APPARATUS ENCAPSULATED WITH HYDROPHOBIC ORGANIC FILM AND MANUFACTURING METHOD THEREOF", the content of which is incorporated herein by reference in its entirety.

TECHNICAL FIELD

The present disclosure relates to the technical field of organic light emitting display, and particularly to an organic light emitting display apparatus encapsulated with a hydrophobic organic film, a manufacturing method thereof, and a hydrophobic organic composite material.

BACKGROUND OF THE INVENTION

Since an organic light emitting display generally known as an OLED display is self-luminescent, the OLED display has a lower power consumption, a higher brightness and a higher response speed as compared with the conventional liquid crystal display. Thus, the OLED display is studied as a main research object in the field of the display.

The OLED display includes an organic light emitting layer having a light emitting function, which is very sensitive to external environmental factors such as moisture and oxygen. Thus, if an OLED display stand is exposed to the environment with the moisture or oxygen, the performances of the devices in the OLED display may be significantly deteriorated or be completely damaged. In order to improve a service life of the OLED and a stability of the device, a sealing process must be adopted to encapsulate the device. For example, in an existing organic light emitting diode (OLED) display, an encapsulation structure with multiple blocking layers is configured to isolate the display from moisture and oxygen. However, in the conventional technology, the blocking layer is generally made from an inorganic material, which results in some problems. For example, since each of the film layers is made from an inorganic material, the deposited film has a large internal stress, and the produce has a low reliability. The produce, generated by depositing the inorganic materials, has unavoidable defects such as micro cracks and impurity doping, which may result in an adverse effect for the encapsulation.

BRIEF SUMMARY OF THE INVENTION

One inventive aspect is an organic light emitting display apparatus. The display apparatus includes a substrate, an organic light emitting unit on the substrate, and a film encapsulation layer on the organic light emitting unit. The film encapsulation layer includes a hydrophobic organic layer disposed at an outermost portion of the film encapsulation layer.

Another inventive aspect is a method for manufacturing an organic light emitting display apparatus. The method includes providing a substrate, forming an organic light emitting unit on the substrate, and forming a film encapsulation layer covering the organic light emitting unit. Forming the film encapsulation layer includes forming at least a hydrophobic organic layer covering the organic light emitting unit with a plasma enhanced chemical vapor deposition method. In addition, the film encapsulation layer includes the hydrophobic organic layer, and the hydrophobic organic layer is disposed at an outermost portion of the film encapsulation layer.

BRIEF DESCRIPTION OF THE DRAWINGS

In order to more clearly explain the technical solutions according to the embodiments of the present disclosure, the accompanying drawings used in the description of the embodiments will be briefly described below. It is obvious that the accompanying drawings in the following description are only some embodiments of the present disclosure. For those skilled in the art, other accompanying drawings may be obtained according to these accompanying drawings without any creative work.

DETAILED DESCRIPTION OF THE PREFERRED EMBODIMENTS

The technical solutions according to the embodiment of the present disclosure will be described clearly and thoroughly below in conjunction with the accompanying drawings. It is obvious that the embodiments described are only a part of and not all of the embodiments according to the present disclosure. All the other embodiments obtained by those skilled in the art based on the embodiments in the present disclosure without any creative work belong to the protection scope of the present disclosure.

In order to more clearly illustrate the present disclosure, the components not mentioned in the description is omitted in the accompanying drawings, and the same reference indicates similar elements throughout the whole description.

In addition, sizes and thicknesses of the structural assemblies are shown randomly for convenience of illustrating, the present disclosure is not limited thereto.

In the accompanying drawings, the thicknesses of a layer, a film, a panel, and a region are enlarged for clarity. It should be understood that when an element such as a layer, a film, a region or substrate is referred to as being "on" the other element, it can be directly on the other element or an intervening element may also be presented. In contrast, when an element is referred to as "directly on" the other element, there is no an intervening element.

An organic light emitting display apparatus encapsulated with a hydrophobic organic film, a manufacturing method thereof, and a hydrophobic organic composite material are provided according to the disclosure. The organic light emitting display apparatus includes: a substrate, an organic light emitting unit formed on the substrate; and a film encapsulation layer formed on the organic light emitting unit, wherein the film encapsulation layer includes at least a hydrophobic organic layer disposed at an outermost structure of the film encapsulation layer. Thus, when the moisture enters the OLED, the hydrophobic organic layer, as a first line of defense, may block moisture effectively, by which the OLED is prevented from immersing. Furthermore, the hydrophobic organic layer may eliminate the stress generated by an inorganic blocking layer to minimize the stress of the overall film encapsulation layer.

In the present disclosure, the plasma is polymerized to form a hydrophobic organic layer in plasma enhanced chemical vapor deposition (PECVD) method by using fluorinated silane and silane as a precursor. The hydrophobic organic layer may include different components due to different process conditions. Therefore, the nature of the hydrophobic organic layer may be easily adjusted as required. In addition, the hydrophobic organic layer includes chemical bonds of C—F, Si—C, Si—O—Si, C—H, and the like.

Figure 1:
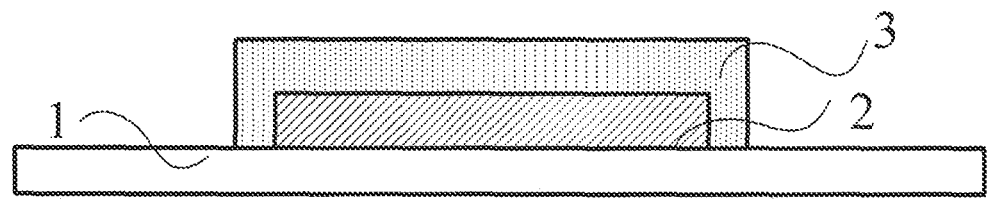
FIG. 1 is a schematic diagram of an organic light emitting display apparatus according to a first embodiment.

As shown in FIG. 1, an organic light emitting display apparatus 10 encapsulated with a hydrophobic organic film is provided according to a first embodiment of the present disclosure, which includes: a substrate 1, an organic light emitting unit 2; and a film encapsulation layer. The film encapsulation layer includes at least a hydrophobic organic layer 3.

The organic light emitting unit 2 is formed on the substrate 1; and the film encapsulation layer is formed on the organic light emitting unit 2. The film encapsulation layer includes at least the hydrophobic organic layer 3 disposed at the outermost structure of the film encapsulation layer.

A contact angle between the hydrophobic organic layer 3 and the moisture is 90° to 170°, and more preferably is 110° to 160°.

Figure 8:
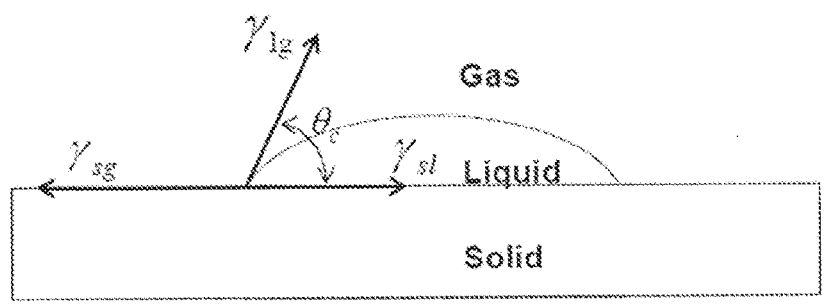
FIG. 8 is a principle diagram of forming a liquid droplet on a solid surface by gas.

FIG. 8 is a principle diagram of forming a liquiddroplet on a solid surface by gas, in which the following equation is satisfied.

$$\gamma_{sg} = \gamma_{sl} + \gamma_{lg} \cos \theta_c$$

where $\theta_c$ is an angle where an interface of liquid and vapor meets a solid surface, which is generally known as a contact angle;

$r_{sg}$ is a solid-vapor interfacial energy; $r_{sl}$ is a solid-liquid interfacial energy; and $r_{lg}$ is a liquid-vapor interfacial energy.

When the contact angle $\theta_c$ of the moisture (e.g. water) and a surface of a certain material is greater than 90°, the surface of the material would not be wetted by the moisture, i.e., this material is a hydrophobic material. Therefore, in order to prevent the organic light emitting unit 2 from being wetted by moisture and the like, at least the hydrophobic organic layer 3 may be disposed at the outermost of the film encapsulation layer. Since the contact angle between the hydrophobic organic layer 3 and the moisture is 90° to 170°, which is greater than 90°, the hydrophobic organic layer has a good impermeability. Therefore, the hydrophobic organic layer 3 may prevent moisture from penetrating rapidly into the organic light emitting display device 10, a lag time of moisture penetrating is increased and thus the service life of the devices such as the organic light emitting element 2 is lengthened.

The hydrophobic organic layer 3 may be a fluorinated hybrid polymer organic film having a good hydrophobicity, which is manufactured in plasma enhanced chemical vapor deposition method by using fluorinated silane and silane with hydrophobicity as a precursor. Preferably, the fluorinated hybrid polymer organic film is manufactured by selecting heptadecafluorodecyl trimethoxysilane (FAS-17) and tetramethoxysilane (TMS) as a precursor. The manufactured fluorinated hybrid polymer organic film includes, in atomic percent, 10 at % to 50 at % of fluorine atom F, 1 at % to 30 at % of silicon atom Si, 1 at % to 30 at % of oxygen atom O, and 15 at % to 50 at % of carbon atom C.

In addition, the fluorinated hybrid polymer organic film contains chemical bonds of C—F, Si—C, Si—O—Si, C—H, and the like, which makes it having a good hydrophobicity.

Figure 2:
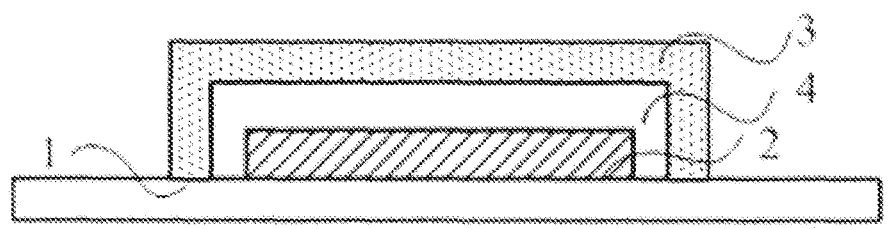
FIG. 2 is a schematic diagram of an organic light emitting display apparatus according to a second embodiment.

As shown in FIG. 2, an organic light emitting display apparatus 10 encapsulated with a hydrophobic organic film is provided according to a second embodiment of the present disclosure. The second embodiment differs from the first embodiment in that the film encapsulation layer further includes an inorganic blocking layer 4. Other structures in the second embodiment are basically the same as that disclosed according to the first embodiment, which will not be described herein.

Specifically, the film encapsulation layer further includes an inorganic blocking layer 4 located between the organic light emitting unit 2 and the hydrophobic organic layer 3. The hydrophobic organic layer 3 is disposed at the outermost structure of the film encapsulation layer, The inorganic blocking layer 4 is formed in atomic layer deposition (ALD) method, plasma enhanced chemical vapor deposition (PECVD) method or physical vapor deposition (PVD) method. Generally, the inorganic blocking layer 4 is optionally made from one or more of a metal oxide, a metal nitride, a silicon oxide or a silicon nitride, such as, $Al_2O_3$, $TiO_2$, ZrO, $SiO_2$, MON, AlN, SiON, ZnO, ZnS, MgO or MgS.

The hydrophobic organic layer 3 has a thickness in a range of 500 nm to 3000 nm. The inorganic blocking layer 4 has a thickness in a range of 300 nm to 1000 nm. The thickness of the hydrophobic organic layer 3 is larger than the thickness of the inorganic blocking layer 4, and thus the hydrophobic organic layer 3 may eliminate the stress generated by an inorganic blocking layer 4. The stress is a disadvantage to the organic light emitting unit. In general, the thicker the thickness of the hydrophobic organic layer 3 and the inorganic blocking layer 4 is, the better the impermeability is. However, in practice, it is necessary to consider an effect of a thickness of the whole film encapsulation layer on the lighting and thinning of the organic light emitting display device and other process factors. Thus, above thickness range is generally selected.

In the film encapsulation layer according to the embodiment, the hydrophobic organic layer 3 is disposed at the outermost structure of the film encapsulation layer, and the inorganic blocking layer 4 is located between the organic light emitting unit 2 and the hydrophobic organic layer 3. Due to the presence of the inorganic blocking layer 4, as compared with the case that only the single hydrophobic organic layer 3 is used in the film encapsulation layer, a curved path along which the moisture immerges is provided, and thus the lag time is further increased and the impermeability is improved. In this case, the moisture permeability of the film encapsulation layer is smaller than $10^{-6}$ g/m$^2$/day. In addition, the hydrophobic organic layer 3 may further eliminate the residual rigid stress, which is caused by the inorganic blocking layer 4 in a certain extent and result in an adverse effect on the organic light emitting unit 2.

Of course, a specific structure of the film encapsulation layer may also be further optimized. Specifically, the film encapsulation layer is formed by periodically and alternately overlapping the hydrophobic organic layer 3 and the inorganic blocking layer 4, and disposing the hydrophobic organic layer 3 at the outermost structure of the film encapsulation layer. The number of layers, each of which includes one hydrophobic organic layer 3 and one inorganic blocking layer 4 which are overlapped, is N, where 1≤N≤10, and N is a positive integer, more preferably, 1≤N≤5, and N is a positive integer. The film encapsulation layer has a thickness in a range of 0.5 μm to 10 μm. The thickness of the film encapsulation layer may depend on the number of layers, each of which includes one hydrophobic organic layer 3 and one inorganic blocking layer 4 which are overlapped. However, the above thickness of the film encapsulation layer is preferable in the term of the whole structure of an organic light emitting device.

Figure 3:
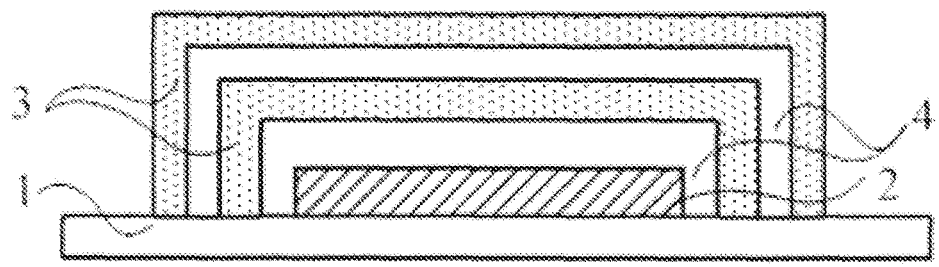
FIG. 3 is a schematic diagram of another organic light emitting display apparatus according to the second embodiment.
Figure 4:
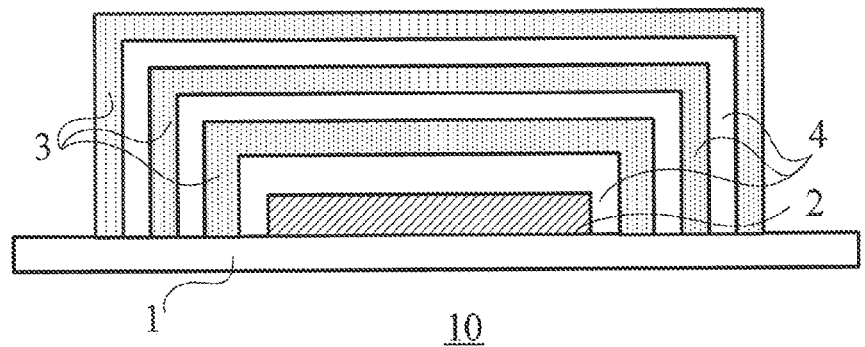
FIG. 4 is a schematic diagram of yet another organic light emitting display apparatus according to the second embodiment.

As shown in FIG. 3 and FIG. 4, a film encapsulation layer of an organic light emitting display apparatus 10 shown in FIG. 3 differs from that of above described organic light emitting display apparatus shown in FIG. 2 in that: the hydrophobic organic layer 3 and the inorganic blocking layer 4 are periodically and alternately overlapped two times, and the hydrophobic organic layer 3 is disposed at the outermost structure of the film encapsulation layer.

A film encapsulation layer of an organic light emitting display apparatus 10 shown in FIG. 4 differs from that of above described organic light emitting display apparatus shown in FIG. 2 in that: the hydrophobic organic layer 3 and the inorganic blocking layer 4 are periodically and alternately overlapped three times, and the hydrophobic organic layer 3 is disposed at the outermost structure of the film encapsulation layer.

The film encapsulation layer may be formed by periodically and alternately overlapping the hydrophobic organic layer 3 and the inorganic blocking layer 4. Thus, the curved path along which the moisture immerges is increased, the lag time is further increased, and thus the impermeability of the whole film encapsulation layer is improved. In addition, as shown in FIG. 3 and FIG. 4, the inorganic blocking layer 4 is generally sandwiched between two hydrophobic organic layers 3, and the thickness of the inorganic blocking layer 4 is smaller than the thickness of the hydrophobic organic layer 3. Therefore the stress generated by depositing the inorganic blocking layer 4 may be eliminated.

The number of layers, each of which includes one hydrophobic organic layer 3 and one inorganic blocking layer 4 which are alternately overlapped, may be adjusted as required, which will not be described herein and is not shown in the accompanying drawings. The present disclosure is not limited to the above embodiments.

Figure 5:
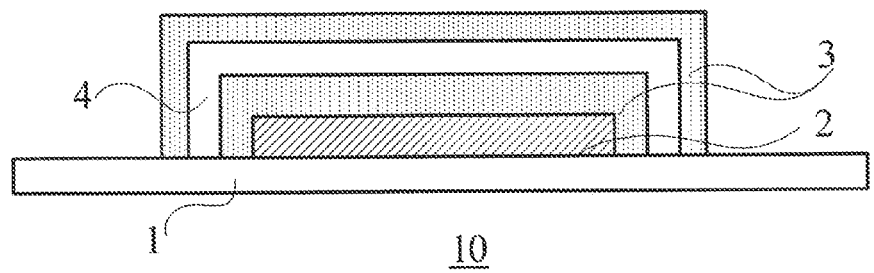
FIG. 5 is a schematic diagram of an organic light emitting display apparatus according to a third embodiment.
Figure 6:
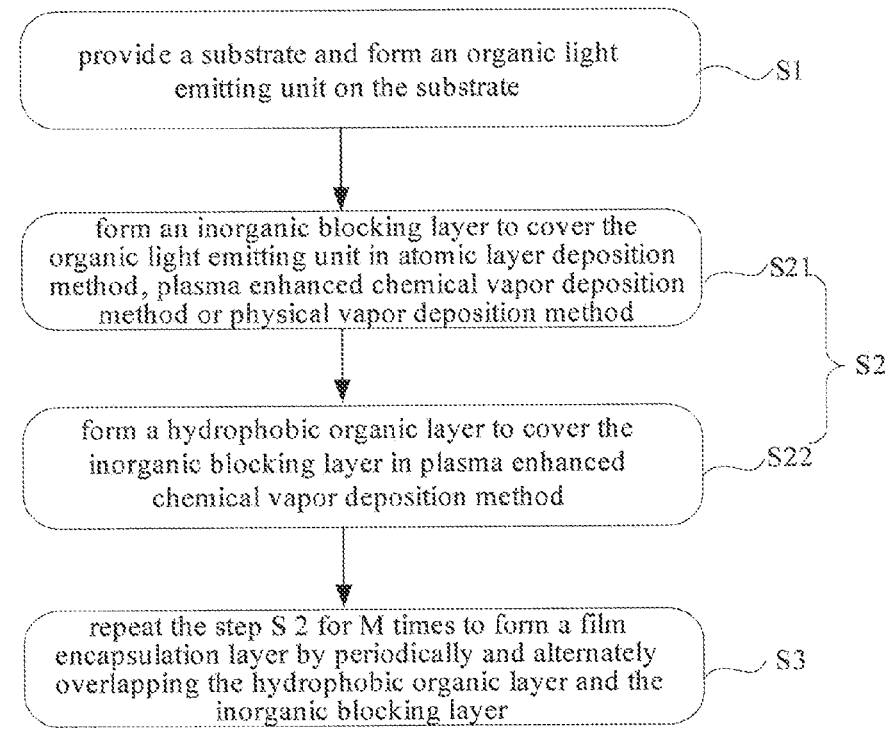
FIG. 6 is a schematic diagram of a method for manufacturing an organic light emitting display apparatus according to a fourth embodiment.

As shown in FIG. 5, an organic light emitting display apparatus 10 encapsulated with a hydrophobic organic film is provided according to a third embodiment of the present disclosure, which has a structure similar with the structure disclosed according to the first embodiment, which will not be described herein.

Specifically, the third embodiment differs from the second embodiment in that: the film encapsulation layer includes multiple hydrophobic organic layers 3. One of the hydrophobic organic layers 3 may be disposed at the outermost structure of the film encapsulation layer. Another hydrophobic organic layer 3 may be disposed at the innermost structure of the film encapsulation layer, i.e., the organic light emitting unit 2 may be directly covered by the hydrophobic organic layer 3, as shown in FIG. 5.

The film encapsulation layer may be formed by periodically and alternately overlapping the hydrophobic organic layers 3 and the inorganic blocking layer 4. One of hydrophobic organic layers 3 may be disposed at the outermost structure of the film encapsulation layer, and another hydrophobic organic layer 3 may be disposed at the innermost structure of the film encapsulation layer. The number of layers, each of which includes one hydrophobic organic layer 3 and one inorganic blocking layer 4 which are alternately overlapped, is N, where 1≤N≤10, and N is a positive integer; more preferably 1≤N≤5, and N is a positive integer. The film encapsulation layer has a thickness in a range of 0.5 μm to 10 μm.

The number of layers, each of which includes one hydrophobic organic layer 3 and one inorganic blocking layer 4 which are alternately overlapped, may be adjusted as required, which will not be described herein and is not shown in the accompanying drawings. The present disclosure is not limited to the above embodiments.

As shown in FIG. 6 and FIGS. 7a to 7d, based on the first, second and third embodiments, a fourth embodiment of the present disclosure discloses a method for manufacturing an organic light emitting display apparatus. The method includes the following Step S1 to Step S3.

Figure 7A:
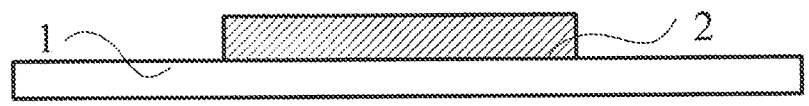
FIG. 7a to FIG. 7d are flowcharts of a method for manufacturing an organic light emitting display apparatus according to the fourth embodiment.

In Step S1, a substrate 1 is provided and an organic light emitting unit 2 is formed on the substrate 1, as shown in FIG. 7a.

In Step S2, a film encapsulation layer is formed to cover the organic light emitting unit 2. Specifically, Step S2 includes: forming at least a hydrophobic organic layer 3 for covering the organic light emitting unit 2 in plasma enhanced chemical vapor deposition method. The film encapsulation layer includes at least the hydrophobic organic layer 3 disposed at an outermost structure of the film encapsulation layer. A contact angle between the hydrophobic organic layer and moisture is 90° to 170°, and more preferably is 110° to 160°.

Step S2 includes Step S21 and Step S22.

Figure 7B:
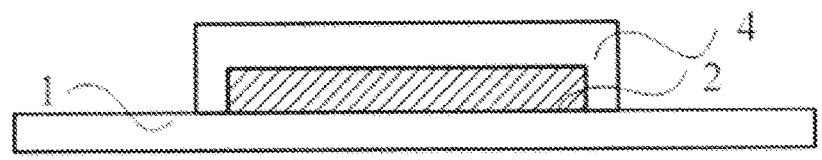

Specifically, Step S21 includes: forming an inorganic blocking layer 4 to cover the organic light emitting unit 2 in atomic layer deposition (ALD) method, plasma enhanced chemical vapor deposition (PECVD) method or physical vapor deposition (CVD) method. The inorganic blocking layer 4 is made from one or more of a metal oxide, a metal nitride, a silicon oxide or a silicon nitride, such as, $Al_2O_3$, $TiO_2$, $ZrO$, $SiO_2$, AlON, AlN, SiON, ZnO, ZnS, MgO or MgS. The inorganic blocking layer 4 has a thickness in a range of 300 nm to 1000 nm, as shown in FIG. 7b. It is preferable to form the inorganic blocking layer 4 in plasma enhanced chemical vapor deposition (PECVD)method, because the hydrophobic organic layer 3 in the next step S22 is also formed in PECVD. In this way, the same process is employed in two steps, and the process is simple.

Figure 7C:
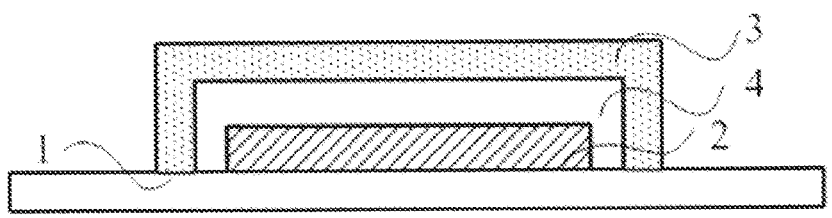

Specially, Step S22 includes: forming the hydrophobic organic layer 3 to cover the inorganic blocking layer 4 in plasma enhanced chemical vapor deposition method by using fluorinated silane and silane as a precursor, preferably, using heptadecafluorodecyl trimethoxysilane and tetramethoxysilane as a precursor, as shown in FIG. 7c. The hydrophobic organic layer 3 has a thickness in a range of 500 nm to 3000 nm. The thickness of the hydrophobic organic layer 3 is larger than the thickness of the inorganic blocking layer 4, and thus the stress generated by the inorganic blocking layer 4 can be eliminated.

Figure 7D:
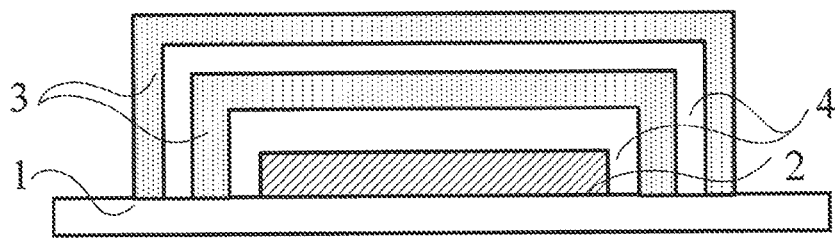

Furthermore, the method for manufacturing the organic light emitting display apparatus further includes:

Step S3, repeating the Step S2 by M times to form the film encapsulation layer by periodically and alternately overlapping the hydrophobic organic layer 3 and the inorganic blocking layer 4, where 0≤M≤10, and M is a positive integer. In FIG. 7d, only M=1, that is, Step S2 is repeatedly performed for one time, as shown in FIG. 7d. However, the present disclosure is not limited thereto. The repeating times may depend on the actual product and process conditions.

In Step S2, the film encapsulation layer for covering the organic light emitting unit 2 is formed. The film encapsulation layer includes multiple hydrophobic organic layers 3. One of the hydrophobic organic layers 3 may be disposed at the innermost structure of the film encapsulation layer, i.e., the hydrophobic organic layer 3 directly covers the organic light emitting unit 2. In addition, another hydrophobic organic layer 3 may be disposed at the outermost structure of the film encapsulation layer. The forming sequence of the film encapsulation layer may be adjusted suitably, which is not limited to the method described above.

In addition, it should be noted that the hydrophobic organic layer 3 is a fluorinated hybrid polymer organic film, which is described in the first embodiment and will be omitted here.

Based on the first, second, third, and fourth embodiments, a fifth embodiment of the present disclosure discloses a hydrophobic organic composite material, which includes a fluorinated hybrid polymer organic film manufactured in plasma enhanced chemical vapor deposition method (PECVD) by using fluorinated silane and silane as a precursor, more preferably, using heptadecafluorodecyl trimethoxysilane (FAS-17) and tetramethoxysilane (TMS) as a precursor. A contact angle between the hydrophobic organic layer and moisture is 90° to 170°, and more preferably is 110° to 160°.

The fluorinated hybrid polymer organic film includes, in atomic percent, 10 to 50 at % of fluorine atom F, 1 at % to 30 at % of silicon atom Si, 1 at % to 30 at % of oxygen atom O, and 15 at % to 50 at % of carbon atom C. The fluorinated hybrid polymer organic film contains chemical bonds of C—F, Si—C, Si—O—Si, C—H, and the like, which makes it having a good hydrophobicity. A contact angle between the fluorinated hybrid polymer organic film and the moisture is 110° to 170°.

This embodiment discloses a method for manufacturing the above hydrophobic organic composite material, which includes:

providing a substrate in the case that a pressure in a reaction chamber is lower than 100 Pa, more preferably 25 Pa to 50 Pa, where the substrate has a temperature lower than 100 Celsius degree, and more preferably 50 Celsius degree to 70 Celsius degree;

using fluorinated silane and silane as a precursor, generally using heptadecafluorodecyl trimethoxysilane (FAS-17) and tetramethoxysilane (TMS) as a precursor, and using an inert gas, generally Ar, as a carrier gas, wherein a flow ratio of fluorinated silane to silane is 1:10-10:1, more preferably is 1:1; and depositing fluorinated silane and silane on the substrate in plasma enhanced chemical vapor deposition method to form the fluorinated hybrid polymer organic film.

The hydrophobicities of the fluorinated hybrid polymer organic films formed at different reaction conditions are shown in table 1, where the substrate has a temperature of 70 Celsius degree, the power of the carrier gas Ar is 300 W, and a distance from an upper electrode to the substrate is 100 mm.

TABLE 1

|  | contact angle | Pressure of Reaction chamber/Pa | Flow ratio (FAS-17/TMS) |
|---|---|---|---|
| First embodiment | 118° | 25 | 1/1 |
| Second embodiment | 120° | 30 | 1/1 |

TABLE 1-continued

|  | contact angle | Pressure of Reaction chamber/Pa | Flow ratio (FAS-17/TMS) |
|---|---|---|---|
| Third embodiment | 143° | 40 | 1/1 |
| Fourth embodiment | 160° | 50 | 1/1 |
| Comparative example | 102° | 50 | Only FAS-17 |

Referring to table 1, a contact angle between the fluorinated hybrid polymer organic film and the moisture is greater than 110°, thus the fluorinated hybrid polymer organic film has a good hydrophobicity.

Through elemental analysis, the elements in the fluorinated hybrid polymer organic films manufactured at above different conditions are shown in atomic percentages/at % in detail in table 2. Atomic percentage of the elements in the fluorinated hybrid polymer organic film manufactured according to the fourth embodiment is shown in table 2, where the contact angle between the fluorinated hybrid polymer organic film and the moisture is 160°.

TABLE 2

|  | Si/at % | F/at % | C/at % | O/at % |
|---|---|---|---|---|
| Fourth embodiment | 15 | 40 | 35 | 10 |
| Comparative Example | 10 | 42 | 29 | 19 |

In addition, the structure of the fluorinated hybrid polymer organic film manufactured is analyzed by an infrared (IR) spectroscopy, to see chemical bonds contained in the manufactured fluorinated hybrid polymer organic film: Si—O—Si (a stretching vibration peak is at 1100 cm$^{-1}$, 810 cm$^{-1}$ and 420 cm$^{-1}$), C-Fx (a stretching vibration peak is in a range of 1120 cm$^{-1}$ to 1350 cm$^{-1}$), Si—CHx. (a stretching vibration peak is in a vicinity of 1270 cm$^{-1}$).

The embodiments of the present invention are described herein in a progressive manner, with the emphasis of each of the embodiments on the difference between it and the other embodiments; hence, for the same or similar parts between the embodiments, one can refer to the other embodiments.

The above description of the disclosed embodiments enables those skilled in the art to implement or utilize the present invention. It will be apparent for those skilled in the art to modify the embodiments in various ways. The general principles defined herein can be implemented in other embodiments without departing from the spirit and the scope of the present invention. Therefore, the present invention is not limited to these embodiments shown herein, but includes the broadest scope consistent with the principles and the novelty features disclosed herein.

What is claimed is:

1. An organic light emitting display apparatus, comprising:
a substrate,
an organic light emitting unit on the substrate; and
a film encapsulation layer on the organic light emitting unit, wherein the film encapsulation layer comprises a hydrophobic organic layer disposed at an outermost portion of the film encapsulation layer,
wherein the hydrophobic organic layer is a fluorinated hybrid polymer organic film, and the fluorinated hybrid polymer organic film comprises, in atomic percent, 10 at % to 50 at % of fluorine atom F, 1 at % to 30 at % of silicon atom Si, 1 at % to 30 at % of oxygen atom O, and 15 at % to 50 at % of carbon atom C.

2. The organic light emitting display apparatus according to claim 1, wherein a contact angle between the hydrophobic organic layer and water ranges from 90° to 170°.

3. The organic light emitting display apparatus according to claim 2, wherein a contact angle between the hydrophobic organic layer and water ranges from 110° to 160°.

4. The organic light emitting display apparatus according to claim 1, wherein the film encapsulation layer further comprises at least an inorganic blocking layer disposed between the organic light emitting unit and the hydrophobic organic layer.

5. The organic light emitting display apparatus according to claim 4, wherein the film encapsulation layer comprises alternately overlapping one or more hydrophobic organic layers and one or more inorganic blocking layers.

6. The organic light emitting display apparatus according to claim 5, wherein the film encapsulation layer comprises a plurality of layers, wherein each layer includes one hydrophobic organic layer and one inorganic blocking layer which are overlapped, and wherein the number of the layers is N, where 1≤N≤10, and N is a positive integer.

7. The organic light emitting display apparatus according to claim 6, wherein the film encapsulation layer comprises a plurality of layers, wherein each layer includes one hydrophobic organic layer and one inorganic blocking layer which are overlapped, and the number of the layers is N, where 1≤N≤5, and N is a positive integer.

8. The organic light emitting display apparatus according to claim 1, wherein the hydrophobic organic layer has a thickness in a range of 500 nm to 3000 nm.

9. The organic light emitting display apparatus according to claim 4, wherein the inorganic blocking layer has a thickness in a range of 300 nm to 1000 nm.

10. The organic light emitting display apparatus according to claim 4, wherein the film encapsulation layer has a thickness in a range of 0.5 μm to 10 μm.

11. The organic light emitting display apparatus according to claim 1, wherein the hydrophobic organic layer is made from a precursor comprising fluorinated silane and silane.

12. The organic light emitting display apparatus according to claim 11, wherein the hydrophobic organic layer is made from a precursor comprising heptadecafluorodecyl trimethoxysilane and tetramethoxysilane.

13. The organic light emitting display apparatus according to claim 11, wherein the hydrophobic organic layer is formed with a plasma enhanced chemical vapor deposition method.

14. The organic light emitting display apparatus according to claim 4, wherein the inorganic blocking layer comprises one or more of a metal oxide, a metal nitride, a silicon oxide, and a silicon nitride.

15. The organic light emitting display apparatus according to claim 14, wherein the inorganic blocking layer is formed with an atomic layer deposition method, a plasma enhanced chemical vapor deposition method, or a physical vapor deposition method.

16. The organic light emitting display apparatus according to claim 4, wherein the hydrophobic organic layer has a thickness larger than that of the inorganic blocking layer.

17. The organic light emitting display apparatus according to claim 4, wherein the hydrophobic organic layer and the inorganic blocking layer are formed by a same deposition method.

18. The organic light emitting display apparatus according to claim 1, wherein the hydrophobic organic layer comprising hydrophobic organic material having C—F bond, Si—C bond, Si—O—Si bonds and C—H bond.

* * * * *